(12) United States Patent
Hattass

(10) Patent No.: US 12,339,402 B2
(45) Date of Patent: Jun. 24, 2025

(54) METHOD FOR OPERATING A PHOTODIODE AND DEVICE FOR CARRYING OUT THE METHOD

(71) Applicant: Robert Bosch GmbH, Stuttgart (DE)

(72) Inventor: Mirko Hattass, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 909 days.

(21) Appl. No.: 17/607,759

(22) PCT Filed: Mar. 25, 2020

(86) PCT No.: PCT/EP2020/058309
§ 371 (c)(1),
(2) Date: Oct. 29, 2021

(87) PCT Pub. No.: WO2020/224861
PCT Pub. Date: Nov. 12, 2020

(65) Prior Publication Data
US 2022/0221563 A1    Jul. 14, 2022

(30) Foreign Application Priority Data

May 3, 2019   (DE) .................... 10 2019 206 317.9

(51) Int. Cl.
*G01S 7/48* (2006.01)
*G01S 7/486* (2020.01)
(Continued)

(52) U.S. Cl.
CPC .......... *G01S 7/4868* (2013.01); *G01S 7/4861* (2013.01); *G01S 17/931* (2020.01); *H10F 30/225* (2025.01)

(58) Field of Classification Search
CPC .... G01S 7/4868; G01S 7/4861; G01S 17/931; G01S 7/497; H10F 30/225
See application file for complete search history.

(56) References Cited

U.S. PATENT DOCUMENTS 7,939,790 B1   5/2011   Lee et al.
8,947,659 B1   2/2015   Baastians et al.
(Continued)

FOREIGN PATENT DOCUMENTS

CN   105043539 A   11/2015
CN   107976667 A   5/2018
(Continued)

OTHER PUBLICATIONS

Hu, Jian-ren: "Research of Opto-electronic Match in Long-distance Laser Ranging System Based on APD," Opto-Electronic Engineering 38(1), (2011), pp. 1-5, with English Abstract.
(Continued)

*Primary Examiner* — Tony Ko
(74) *Attorney, Agent, or Firm* — NORTON ROSE FULBRIGHT US LLP

(57) ABSTRACT

A method for operating a photodiode. In the method, a voltage made up of a sum of a constant first voltage and a second voltage having a fixed frequency is applied to the photodiode and an output signal of the photodiode is detected. A spectral composition of the output signal is subsequently detected and at least one coefficient of a non-linear term of a gain of the photodiode is ascertained on the basis of the spectral composition. An adapted first voltage is then applied to the photodiode, the first voltage being adapted based on the coefficient.

14 Claims, 3 Drawing Sheets

(51) Int. Cl.
G01S 7/4861 (2020.01)
G01S 17/931 (2020.01)
H10F 30/225 (2025.01)

(56) References Cited

U.S. PATENT DOCUMENTS

2017/0307738 A1  10/2017  Schwarz et al.
2018/0180471 A1   6/2018  Marra et al.
2018/0231645 A1   8/2018  Droz et al.
2018/0284239 A1  10/2018  Lachapelle et al.
2024/0085538 A1*  3/2024  Grudinin ............... G01S 7/4911

FOREIGN PATENT DOCUMENTS

| | | |
|---|---|---|
| CN | 108344984 A | 7/2018 |
| CN | 108732578 A | 11/2018 |
| CN | 109328310 A | 2/2019 |
| DE | 2257181 A1 | 5/1974 |
| EP | 0856943 A2 | 8/1998 |
| EP | 1006591 A2 | 6/2000 |
| EP | 2056126 A1 | 5/2009 |

OTHER PUBLICATIONS

International Search Report for PCT/EP2020/058309 Issued May 6, 2020.

* cited by examiner

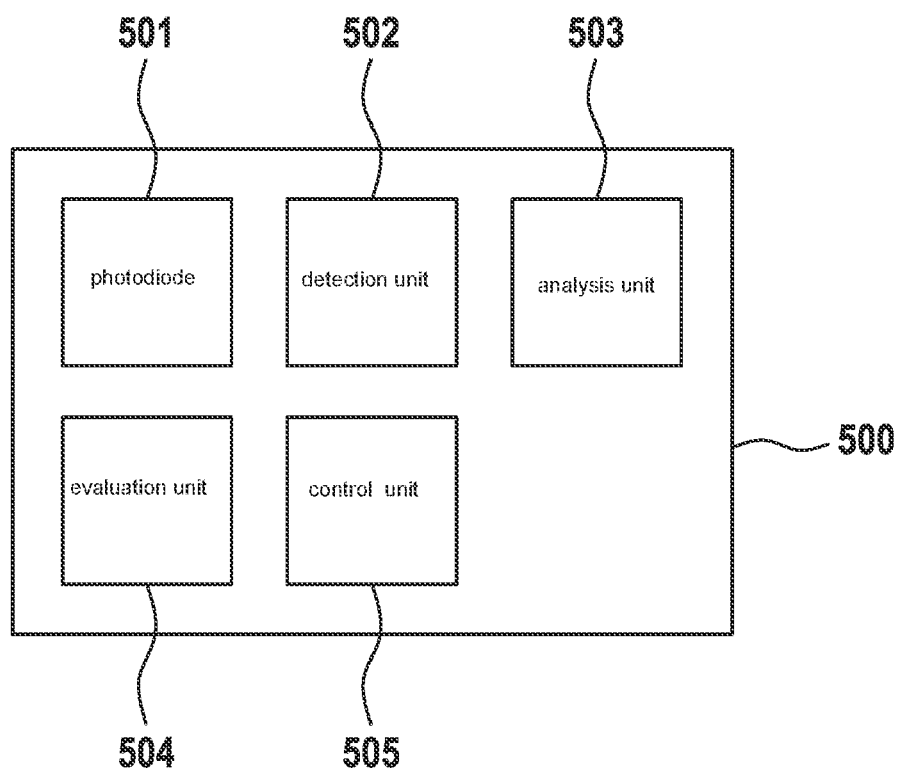

METHOD FOR OPERATING A PHOTODIODE AND DEVICE FOR CARRYING OUT THE METHOD

FIELD

The present invention relates to a method for operating a photodiode.

BACKGROUND INFORMATION

Avalanche photodiodes (APDs) are used for detecting electromagnetic radiation from the infrared spectral range up to the range of gamma rays. They are used in a wide variety of fields such as, for example, in LIDAR systems, in medical technology and in high energy physics. APDs take advantage of the photoelectric effect in order to generate electrons from incident electromagnetic radiation. These primary electrons migrate into a zone having a very high field strength, where they trigger through impact ionization an avalanche effect, which represents a gain of the APD. Of particular interest is the use of APDs as detectors for LIDAR systems in the automotive sector. In this case, a short light pulse is transmitted by a transmitter to a setting, its reflection is registered using an APD and a distance is determined via the propagation time of the light.

The reliable use of an APD in the automotive sector may be hindered by a temperature dependency of the gain. A variation of the temperature has an impact on the formation of a space-charge region and on electronic population densities, which have an impact on the gain. If the compensation of the temperature dependency of the gain is insufficient, a signal-to-noise ratio of the APD may deteriorate significantly. To compensate, the applied voltage at the APD may typically be adapted for various temperatures (approximately ~1 to 1.5 V/K). This requires on the one hand an exact knowledge of the temperature of the APD and on the other hand an exact knowledge of the temperature behavior of the APD. In a real application, however, uncertainties may exist concerning which exact temperature prevails at the APD. It may also be the case that a variation of the temperature behavior occurs across various charges of APDs. Thus, a compensation of the temperature behavior of an APD is possible only to an approximate degree. To minimize temperature effects, the gain for every APD would have to be measured as a function of the applied voltage and the temperature.

A bias circuit for applying a bias voltage at an APD is described in European Patent Application No. EP 1 006 591 A2. A temperature detector detects a temperature around the APD. A memory contains voltage data corresponding to a plurality of temperatures in a prescribed temperature range. The bias voltage is adjusted according to the voltage data in order to compensate for the temperature-related changes of the gain of the APD.

A method for detecting a light pulse reflected at an object is described in European Patent Application No. EP 2 056 126 A1. In this method, a light pulse having a known intensity and duration is emitted in the direction of the object and a reflection signal of the light pulse is detected. A gain sensor amplifies the reflection signal. The gain of the sensor is varied in a controlled manner in order to know the gain at each point in time of the detection.

An APD gain control circuit is described in European Patent Application No. EP 0 856 943 A2, which includes a bias voltage generator for varying a bias voltage at a variable gain APD in response to bias voltage control values, the bias voltage control values being generated by a controller. The controller receives the output signal of the APD and determines a system noise for various bias voltage control values. The system noise is compared with a threshold value in order to ascertain an optimal bias voltage for an optimal gain of the APD.

The methods described in the related art have the disadvantage that a variation of the gain of an APD as a function of the temperature is not able to be or is only insufficiently able to be compensated for. European Patent Application No. EP 1 006 591 A2 describes a temperature compensation on the basis of a temperature measurement. However, the method is not based on an exact knowledge regarding the temperature and the temperature behavior of the APD, since only a temperature around the APD is measured.

SUMMARY

An object of the present invention is to provide an improved method for operating a photodiode. A device for carrying out the method is also to be provided. These objects may be achieved by a method for operating a photodiode and by a device for carrying out the method including the features of example embodiments of the present invention. Advantageous refinements are disclosed herein.

In accordance with an example embodiment of the present invention, a method for operating a photodiode includes the following method steps: In a first method step, a voltage made up of a sum of a constant first voltage and a second voltage is applied to the photodiode at an established frequency. In a second method step, an output signal of the photodiode is detected. In a third method step, a spectral composition of the output signal is ascertained. In a fourth method step, at least one coefficient of a non-linear term of a gain of the photodiode is ascertained on the basis of the spectral composition. In a fifth method step, an adapted first voltage is applied to the photodiode, the first voltage being adapted on the basis of the coefficients.

By applying the adapted first voltage, it is advantageously possible to compensate for a variation of the gain resulting from a temperature change. In this case, however, knowledge of the temperature and/or of a temperature behavior of the photodiode is not necessary. Instead, as a result of the application of the second voltage in the first method step, a test signal is applied to the photodiode in order to determine at least one coefficient of the non-linear term of the gain. This allows for conclusions to be drawn about the instantaneous gain and thus for the application of the adapted first voltage, which may also be referred to as a blocking voltage, in order to control the gain. The method thus enables a supervision and a control of the gain of the photodiode.

In one specific embodiment of the present invention, the voltage is adapted in such a way that the gain remains constant. The photodiode is advantageously able to provide particularly reliable measured data when it is operated with a constant gain. A temperature dependency of the gain may be compensated for without knowledge of the temperature and/or of a temperature behavior of the photodiode.

In one specific embodiment of the present invention, an output of electromagnetic radiation incident on the photodiode is constant when carrying out the method. The determination of the coefficient of the non-linear term of the gain of the photodiode is advantageously not influenced by a variation of an incident intensity of electromagnetic radiation.

In one specific embodiment of the present invention, this may be ensured, for example, in that a measuring period for detecting the output signal is selected in such a way that the output of the electromagnetic radiation incident on the photodiode is constant within the measuring period. In one alternative specific embodiment, the method is carried out in a dark phase of the photodiode. In this case, therefore, only a dark current of the photodiode is amplified and modulated with the aid of the applied test signal.

In one specific embodiment of the present invention, the method is carried out during the operation of a LIDAR system that includes the photodiode. In this case, a pulse frequency of light pulses of the LIDAR system may be selected in one specific embodiment in such a way that a variation of the output signal based on the light pulses and a variation of the output signal based on the applied second voltage are distinguishable from one another. The coefficient of the non-linear term of the gain may be advantageously better determined if the variation of the output signal based on the applied second voltage is no longer superposed with the variation of the output signal based on the light pulses.

The frequency of the second voltage may, in principle, be in a wide frequency range, for example, in a frequency range of 0 Hz to 100 MHz. In one specific embodiment, the frequency of the second voltage is greater than a refresh rate of the LIDAR system and less than an upper limit frequency of a bandwidth of an amplifier of the LIDAR system. In one specific embodiment, the frequency of the second voltage is in a range between 100 Hz and 20 MHz.

In one specific embodiment of the present invention, the spectral composition is ascertained by a Fourier analysis or by demodulation. The Fourier analysis and the demodulation advantageously represent simple methods for ascertaining the spectral composition of the output signal.

In one specific embodiment of the present invention, the photodiode is a part of an automotive LIDAR system and the method is carried out during the operation of the automobile. The photodiode of the LIDAR system is advantageously able to provide reliable measured data during the operation of the automobile, since the gain of the photodiode is controlled. This may improve the efficiency of the LIDAR system. LIDAR systems are used in the automotive sector, for example, in autonomously driving vehicles.

In one specific embodiment of the present invention, the method steps of the method are repeated. By repeating the method, it is advantageously possible to compensate for variations of the gain of the photodiode resulting from rapid temperature changes. The method may, for example, be repeated at discrete time intervals or alternatively virtually continuously.

In accordance with an example embodiment of the present invention, a device for carrying out the method includes a photodiode including connections for applying a voltage, a detection unit for detecting an output signal of the photodiode, an analysis unit for ascertaining a spectral composition of the output signal, an evaluation unit for ascertaining at least one coefficient of a non-linear term of a gain of the photodiode on the basis of the spectral composition and a control unit for adapting the first voltage on the basis of the coefficient. In one specific embodiment, the photodiode is an avalanche photodiode.

BRIEF DESCRIPTION OF THE DRAWINGS

The above-described properties, features and advantages of the present invention and the manner in which these are achieved, are more clearly and explicitly understandable in conjunction with the following description of the exemplary embodiments, which are explained in greater detail in conjunction with the figures.

FIG. 5 schematically shows a device for carrying out the method, in accordance with an example embodiment of the present invention.

DETAILED DESCRIPTION OF EXAMPLE EMBODIMENTS

Figure 1:
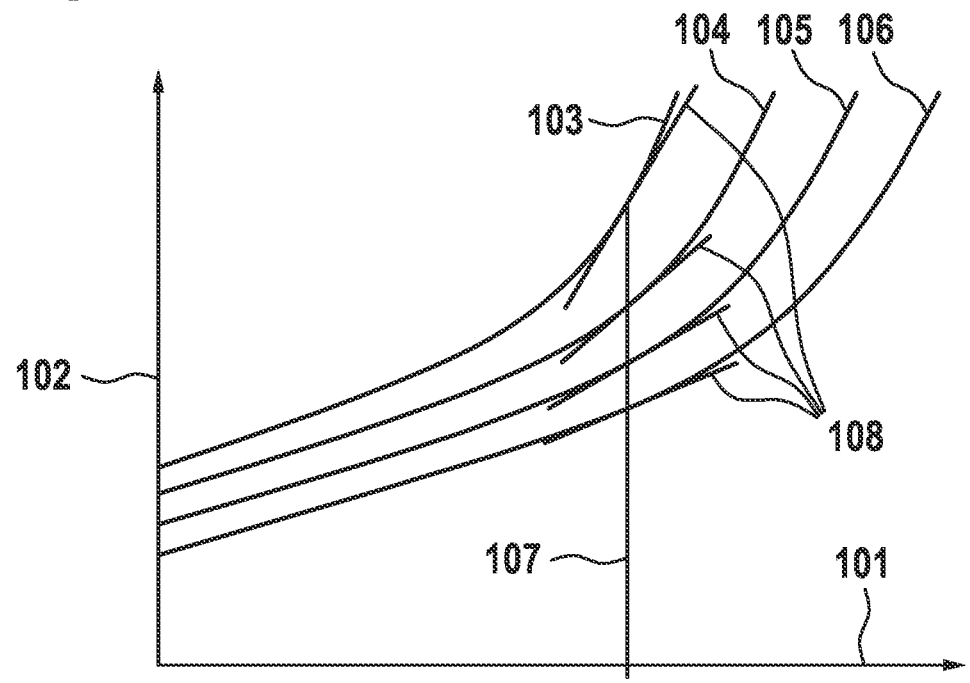
FIG. 1 schematically shows exemplary temperature characteristic curves of a photodiode.

FIG. 1 schematically shows exemplary temperature characteristic curves of a photodiode. The photodiode may, for example, be an avalanche photodiode (APD). APDs take advantage of the photoelectric effect in order to generate electrons from incident electromagnetic radiation. These primary electrons migrate into a zone that has a very high electric field strength where they trigger through impact ionization an avalanche effect, which represents a gain. This form of the gain is an internal gain. The photodiode may, for example, also be a Zener diode, in which the avalanche effect at least partially occurs, which is a function of a voltage applied to the photodiode.

In FIG. 1, a first coordinate axis 101 represents the applied voltage. A second coordinate axis 102 represents the gain of the photodiode. A dependency of the gain is represented, for example, for four different temperatures. A first characteristic curve 103 represents the gain at a first temperature. A second characteristic curve 104 represents the gain at a second temperature. A third characteristic curve 105 represents the gain at a third temperature. A fourth characteristic curve 106 represents the gain at a fourth temperature. As is apparent from FIG. 1, the gain of the photodiode at a fixed voltage 107 is different for different temperatures. In addition, tangents 108 at characteristic curves 103, 104, 105, 106 in FIG. 1 indicate that characteristic curves 103, 104, 105, 106 for fixed voltage 107 exhibit different slopes. Furthermore, curvatures of characteristic curves 103, 104, 105, 106 for fixed voltage 107 are different. The present invention is based on the notion that if knowledge about the curvature of a characteristic curve is possible, it is possible to compensate for variations of the gain resulting from temperature changes, without having detailed pieces of information about the temperature of the photodiode itself. For this purpose, it is necessary to characterize the non-linear behavior of the gain.

In order to describe the non-linear behavior of the gain, the gain may be represented in a first approximation to a linear and to a non-linear (quadratic) term of the applied voltage:

$$G(T, U) = G_0(T)U(t) + G_1(T)U^2(t) \qquad (1)$$

In this case, G is the gain, T is the temperature, U is the voltage applied to the photodiode, t is the time, $G_0$ is a coefficient of the linear term and $G_1$ is a coefficient of the non-linear term. For the applied voltage U, a time-dependent voltage may now be set:

$$U(t) = U_0 + U_A \sin(\omega_0 t) \qquad (2)$$

In this case, $U_0$ is a constant first voltage and $U_A$ is an amplitude of a second voltage having a fixed frequency $\omega_0$.
The result of equations (1) and (2) for the gain is:

$$G(T, U) = G_0(T)U_0 + G_1(T)U_0{}^2 + U_A G_0 \sin(\omega_0 t) + \\ 2G_1(T)U_0 U_A \sin(\omega_0 t) + G_1(T)U_A^2 \cos(2\omega_0 t)/2 \qquad (3)$$

Figure 2:
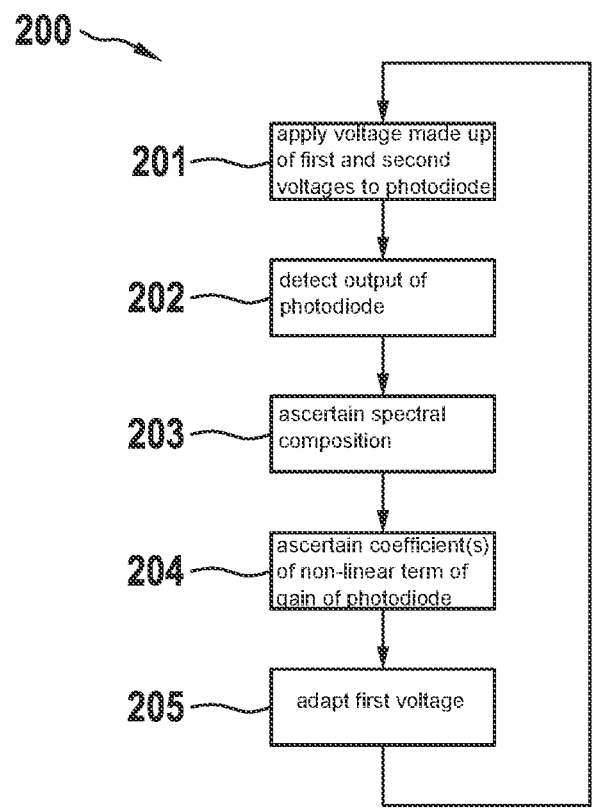
FIG. 2 schematically shows method steps of a method for operating the photodiode, in accordance with an example embodiment of the present invention.

FIG. 2 schematically shows method steps 201, 202, 203, 204, 205 of a method 200 for operating a photodiode.

In a first method step 201, a voltage made up of a sum of a constant first voltage and a second voltage having a fixed frequency is applied to the photodiode. In a second method step 202, an output signal of the photodiode is detected. In a third method step 203, a spectral composition of the output signal is ascertained. In a fourth method step 204, at least one coefficient of a non-linear term of the gain of the photodiode is ascertained on the basis of the spectral composition. In a fifth method step 205, an adapted first voltage is applied to the photodiode, the first voltage being adapted on the basis of the coefficient. Method steps 201, 202, 203, 204, 205 of method 200 may optionally be repeated.

The first voltage is voltage $U_0$, which may also be referred to as a blocking voltage. The second voltage has amplitude $U_A$ and fixed frequency $\omega_0$. The second voltage may also be referred to as a test signal.

Figure 3:
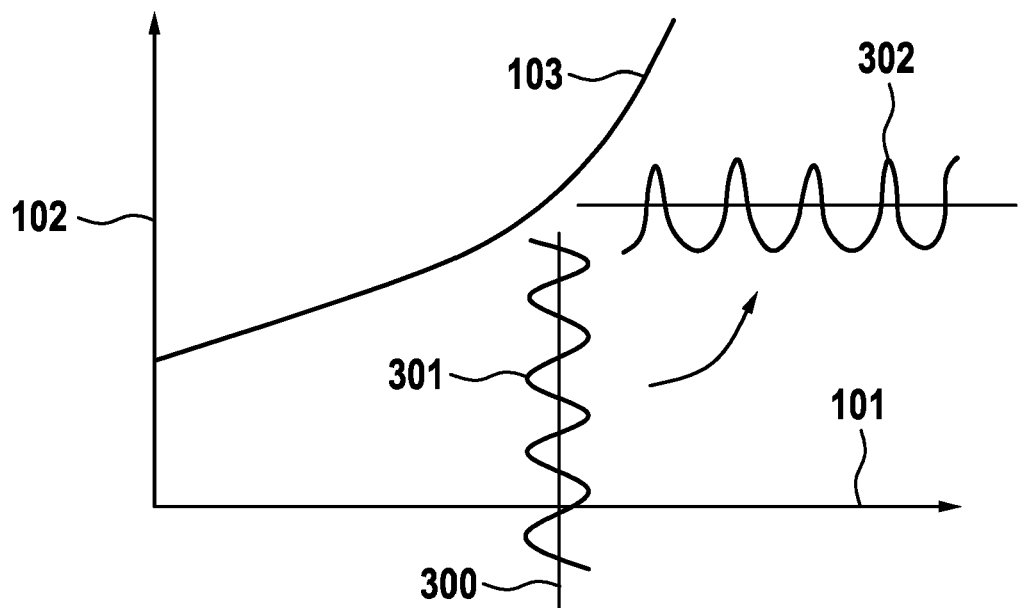
FIG. 3 schematically shows a variation of a gain of the photodiode resulting from the application of a voltage having a fixed frequency.

FIG. 3 schematically shows the variation of gain 302 of the photodiode as a result of the application of second voltage 301 at fixed frequency $\omega_0$. In FIG. 3, first coordinate axis 101 again represents the applied voltage. Second coordinate axis 102 represents the gain of the photodiode. For example, FIG. 3 shows merely first characteristic curve 103 of the gain.

Further represented in FIG. 3 are applied first voltage 300 and a temporal profile of applied second voltage 301 with amplitude of $U_A$ and fixed frequency $\omega_0$. Applied second voltage 301 is accompanied by a variation of gain 302. If the photodiode is exposed, for example, to an incidence of electromagnetic radiation of a constant output when the test signal is applied, i.e. when second voltage 301 is applied, then an output signal is measureable, which is also varied as a result of varying gain 302. The output signal may, for example, be a photocurrent of the photodiode.

As is apparent based on equation (3), gain 302 includes a term, which contains twice the fixed frequency $\omega_0$. For this reason, the spectral composition of the output signal, i.e. a frequency spectrum, is ascertained in third method step 203. Aside from twice the fixed frequency $\omega_0$, the output signal may also include higher-order frequency components. Integer and even multiple of fixed frequency $\omega_0$ are possible.

Figure 4:
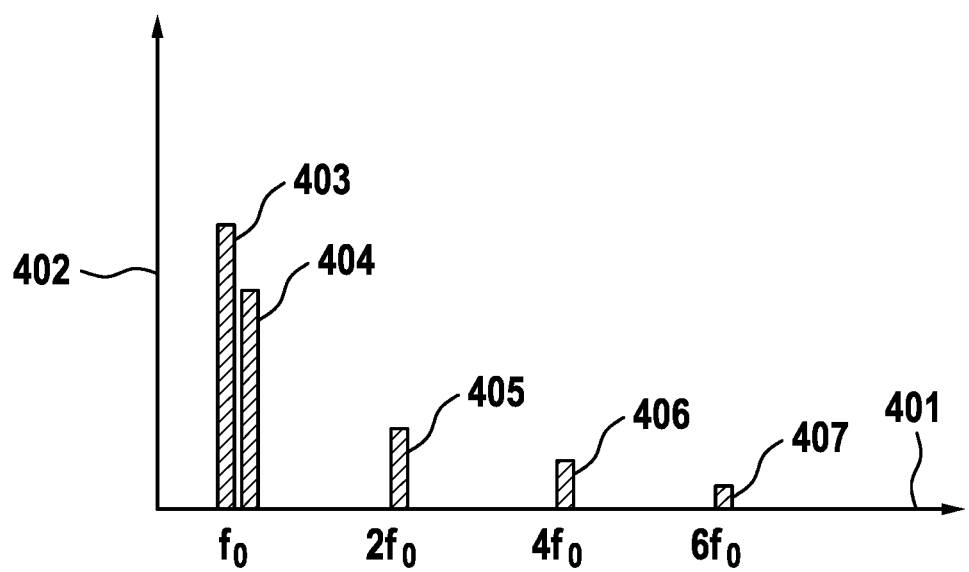
FIG. 4 schematically shows a frequency spectrum of an output signal of the photodiode.

FIG. 4 schematically shows frequency spectra of the test signal and of the output signal. A third coordinate axis 401 represents the frequency. A fourth coordinate axis 402 represents amplitudes of individual frequency components. Thus, frequency spectra are amplitude spectra, for example.

A frequency spectrum of the test signal includes merely one frequency component 403 at fixed frequency $\omega_0$. A frequency spectrum of the output signal includes, in addition to first frequency component 404 at fixed frequency $\omega_0$, further frequency components 405, 406, 407. A second frequency component 405 includes frequency $2\omega_0$. A third frequency component 406 includes frequency $4\omega_0$. A fourth frequency component 405 includes frequency $6\omega_0$. The output signal may also include further integer and even multiple of fixed frequency $\omega_0$.

The spectral composition may be ascertained by a Fourier analysis or by demodulation. In the Fourier analysis, a frequency spectrum is ascertained with the aid of a Fourier transform. For example, an amplitude spectrum may be ascertained, which includes portions of amplitudes of frequency components of the output signal. In demodulation, an envelope in a fixed frequency is ascertained. This frequency should correspond to an integer and even multiples of fixed frequency $\omega_0$ of the second voltage.

In fourth method step 204 of method 200 of FIG. 2, at least one coefficient of a non-linear term of the gain of the photodiode is ascertained on the basis of the spectral composition. In this step, at least coefficient $G_1$ is ascertained. Coefficients of higher order terms of the gain may also be ascertained. However, method 200 is explained below only for the case in which only coefficient $G_1$ of the quadratic term is ascertained. The coefficient of the quadratic term may be ascertained from the amplitude ratios of first frequency component 404 and of second frequency component 405. Coefficient $G_1$ allows conclusions to be drawn about gain G at an instantaneous temperature. On the basis of the ascertained coefficient of the non-linear term of the gain, it is now possible to adapt first voltage $U_0$ in order to adapt gain G. For this reason, the adapted first voltage is applied to the photodiode in fifth method step 205 of method 200. The first voltage may, for example, be adapted in such a way that the gain remains constant. Because the gain is controlled in such a way that it remains constant, the photodiode is able to provide particularly reliable and comparable measured data.

Method 200 of FIG. 2 may be carried out in such a way that an output of electromagnetic radiation incident on the photodiode is constant when carrying out the method. As a result, the output signal of the photodiode is not influenced by a variation of an incident intensity of electromagnetic radiation. This may be ensured in one specific embodiment, for example, by selecting a measuring period for detecting the output signal in such a way that the output of the electromagnetic radiation incident on the photodiode is constant within the measuring period.

Alternatively, the method is carried out in a dark phase of the photodiode. In this case, therefore, only a dark current of the photodiode is amplified and modulated with the aid of the applied test signal.

FIG. 5 schematically shows a device 500 for carrying out method 200 of FIG. 2.

Device 500 includes photodiode 501 including connections for applying a voltage, a detection unit 502 for detecting an output signal of the photodiode, an analysis unit 503 for ascertaining a spectral composition of the output signal, an evaluation unit 504 for ascertaining at least one coefficient of a non-linear term of the gain of the photodiode on the basis of the spectral composition, and a control unit 505 for adapting the first voltage on the basis of the coefficient. In one specific embodiment, the photodiode is designed as an avalanche photodiode.

In method 200 of FIG. 2, the detection unit detects the output signal in second method step 202 and provides it to analysis unit 503. Analysis unit 503 ascertains the spectral composition of the output signal and provides the ascertained spectral composition to evaluation unit 504. Evaluation unit 504 ascertains at least one coefficient of a non-linear term of the gain and provides it to control unit 505. Control unit 505 adapts the first voltage and the adapted first voltage is applied to the photodiode in order to adapt the gain.

Device 500 may, for example, be a part of a LIDAR system. Method 200 of FIG. 2 may also be carried out during the operation of the LIDAR system. In this case, it is advantageous that a pulse frequency of light pulses of the LIDAR system is selected in such a way that a variation of the output signal based on the light pulses and a variation of the output signal based on the applied second voltage are distinguishable from one another.

The frequency of the second voltage may, in principle, be within a wide frequency range, for example, within a frequency range of 0 Hz up to 100 MHz. For the LIDAR system, it is advantageous if the frequency of the second voltage is greater than a refresh rate of the LIDAR system and less than an upper limit frequency of a bandwidth of an amplifier of the LIDAR system. The frequency of the second voltage may, for example, be in a range between 100 Hz and 20 MHz. An amplitude of the second voltage may, for example, be 1 V. This value indicates merely an exemplary scale of the amplitude of the second voltage and is not to be understood as limiting. The first voltage may, for example, be 100 V. The value of 100 V cited by way of example for the first voltage is intended to represent merely a typical scale and is not to be understood as limiting.

The photodiode may also be a part of an automotive LIDAR system. Method 200 of FIG. 2 may also be carried out during the operation of the automobile. At the same time, the method may also be carried out during the operation of the automotive LIDAR system. The photodiode of the LIDAR system is advantageously able to provide reliable measured data during the operation of the automobile, since the gain of the photodiode is controlled.

What is claimed is:

1. A method for operating a photodiode, comprising the following steps:
    applying a voltage made up of a sum of a constant first voltage and a second voltage having a fixed frequency to the photodiode;
    detecting an output signal of the photodiode;
    ascertaining a spectral composition of the output signal;
    ascertaining at least one coefficient of a non-linear term of a gain of the photodiode based on the ascertained spectral composition; and
    applying an adapted first voltage to the photodiode, the adapted first voltage being the first voltage adapted based on the coefficient.

2. The method as recited in claim 1, wherein the first voltage is adapted in such a way that the gain remains constant.

3. The method as recited in claim 1, wherein an output of electromagnetic radiation incident on the photodiode is constant when the method is carried out.

4. The method as recited in claim 3, wherein a measuring period for detecting the output signal is selected in such a way that the output of the electromagnetic radiation incident on the photodiode is constant within the measuring period.

5. The method as recited in claim 4, wherein the method is carried out in a dark phase of the photodiode.

6. The method as recited in claim 1, wherein method is carried out during the operation of a LIDAR system that includes the photodiode.

7. The method as recited in claim 6, wherein a pulse frequency of light pulses of the LIDAR system is selected in such a way that a variation of the output signal based on the light pulses and a variation of the output signal based on the applied second voltage are distinguishable from one another.

8. The method as recited in claim 6, wherein a frequency of the second voltage is greater than a refresh rate of the LIDAR system and less than an upper limit frequency of a bandwidth of an amplifier of the LIDAR system.

9. The method as recited in claim 8, wherein the frequency of the second voltage is in a range between 100 Hz and 20 MHz.

10. The method as recited in claim 1, wherein the spectral composition is ascertained by a Fourier analysis or by demodulation.

11. The method as recited in claim 1, wherein the photodiode is a part of an automotive LIDAR system, and the method is carried out during operation of an automobile in which the automotive LIDAR system is situated.

12. The method as recited in claim 1, wherein the steps of the method are repeated.

13. A device, comprising:
    a photodiode including connections for applying a voltage made up of a sum of a constant first voltage and a second voltage having a fixed frequency;
    a detection unit configured to detect an output signal of the photodiode;
    an analysis unit configured to ascertain a spectral composition of the output signal;
    an evaluation unit configured to ascertain at least one coefficient of a non-linear term of a gain of the photodiode based on the ascertained spectral composition; and
    a control unit configured to adapt the first voltage based on the coefficient.

14. The device as recited in claim 13, wherein the photodiode is an avalanche photodiode.

* * * * *